INVENTOR.
JAMES D. MC COTTER, JR.
BY
Harry W. Hargis III
AGENT

FIG. 5.
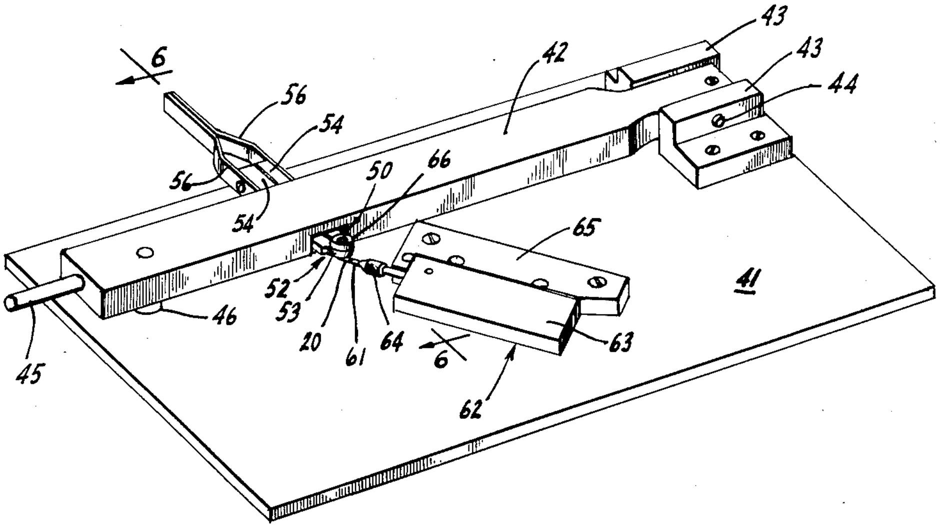
FIG. 6.
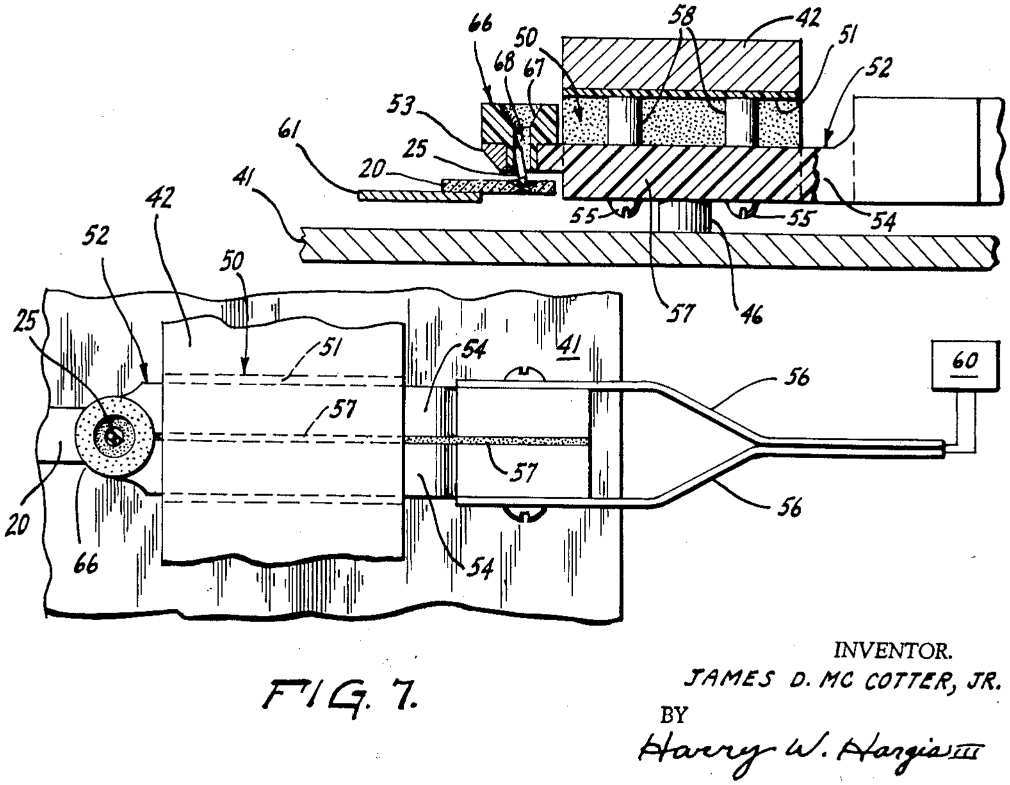
FIG. 6, FIG. 7.
INVENTOR.
JAMES D. MC COTTER, JR.
BY
Harry W. Hargis III
AGENT

United States Patent Office 2,987,597

Patented June 6, 1961

2,987,597

ELECTRICAL COMPONENT ASSEMBLY

James D. McCotter, Jr., Lansdale, Pa., assignor to Philco Corporation, Philadelphia, Pa., a corporation of Pennsylvania Filed Dec. 22, 1959, Ser. No. 861,293
11 Claims. (Cl. 219—9.5)

This invention relates to a method of and apparatus for assembling electrically conductive elements, and more particularly to means utilizing induction heating techniques for effecting solder-assembly of such elements.

While of broader applicability, the invention is especially useful in the fabrication of very small semiconductor devices having at least moderate power application. Accordingly, the invention will be described in relation to the fabrication of a wafer type, medium power, alloy junction transistor.

Semiconductive devices are known in the art which employ so-called alloy-junctions as the active elements thereof such, for example, as the emitter and collector elements of transistors. Such alloy-junctions may be fabricated by applying a body of suitable activator metal to the surface of a semiconductive body of predetermined conductivity type and then heating the metal sufficiently to cause it to melt and to alloy with the underlying portion of the semiconductive body, followed by cooling the metal to permit solidification thereof. Such alloy junctions may be formed, in pairs, in opposing surface regions of the semiconductive body, so as to produce confronting rectifying barriers within the body. Customarily, leads are attached to each of these junctions, or metal contacts, to provide connection to external circuit elements.

The generation of any appreciable energy within such a small device necessitates effective means for dissipating the generated power to avoid excessive thermal loading. Also some type of encapsulation of the semiconductor device is required to prevent contamination thereof. A semiconductive device encapsulating structure in which the present invention has particular utility is disclosed and claimed in the copending application of Ford K. Clarke et al., Serial No. 733,613, filed May 7, 1958, now U.S. Patent 2,977,515, issued March 28, 1961, and assigned to the assignee of the present invention. Briefly the above mentioned application relates to mounting means of low thermal impedance which facilitates handling and processing of a semiconductive device. The aforesaid mounting means comprises, preferably, a nickel plated silver stud upon which the semiconductive device is mounted, as by soldering to the collector contact. In order to ensure optimum dissipation of generated heat an important consideration is that the solder bond of the stud to the collector contact provide close thermal coupling between the semiconductive body and the stud. Some solder bonding techniques heretofore available in the art have not achieved this close contact, whereas others have achieved close coupling only at the risk of irreparably damaging the relatively fragile semiconductive body. For example, techniques falling in the latter category may utilize clamping devices which forcibly restrain the stud against the collector contact while solder bonding is effected. The forces involved of course may vary with operator techniques and, if excessive, will cause the lead, or stud, being soldered to pierce the underlying semiconductive body, thereby ruining the device.

While the present invention has as its primary objective the provision of means for soldering a stud to the collector contact, or electrode, of a semiconductive device, it has as a particular object to provide means for both heating and effecting precision alignment of elements of a semiconductive device being soldered, said means being featured by the requirement of a minimum of attention by the operator.

To the foregoing general ends the present invention contemplates, in both a method and apparatus aspect, use of induction heating means including an induction coil axially aligned with an electrode of a semiconductor device to heat a body of solder contacting a lead wire element, for example a cylindrical stud, and effect solder bonding of the element or stud to the electrode, the opposing field set up by currents induced within the stud per se causing the latter to seek axial alignment with the induction heating coil, whereby precise alignment of the stud with the electrode is achieved.

The invention is featured by lack of need for clamping devices to hold the stud against the electrode, sufficient engaging force being derived from the weight of the magnetically aligned stud.

The manner in which the objects and advantages of the invention may best be achieved will be clearly understood from a consideration of the following description, taken in conjunction with the accompanying drawing in which:

FIGURE 5 is a perspective showing of equipment embodying principles of the invention in its apparatus aspect;

FIGURE 6 is an elevational view, in section, and looking generally in the direction of arrows 6—6 as applied to FIGURE 5; and FIGURE 7 is a plan view, with parts broken away, of apparatus seen in FIGURE 5.

Figures 1, 2, 3, 4:
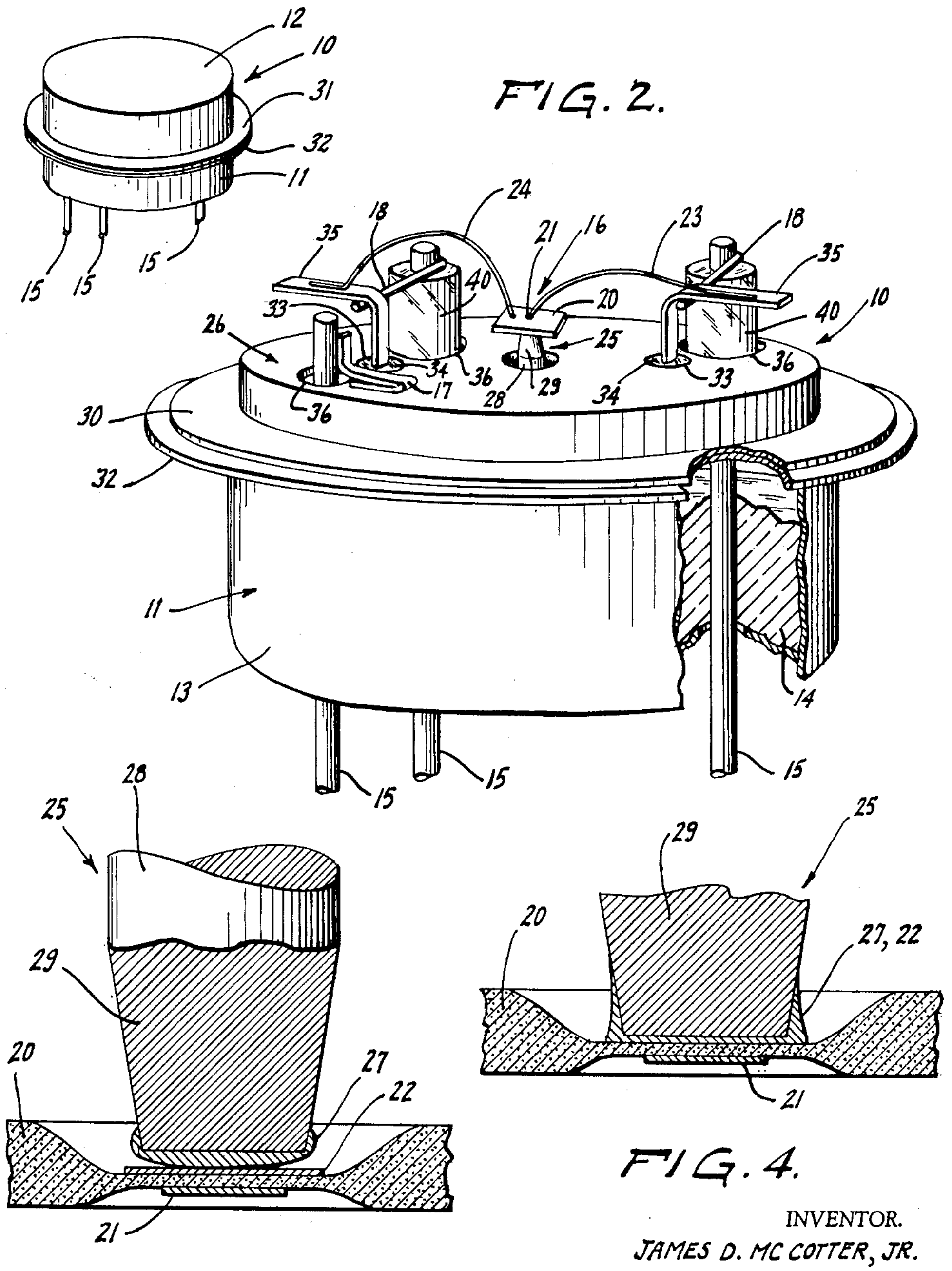
FIGURE 1 is a perspective showing, on a greatly enlarged scale, of a semiconductive device made in accordance with the invention.
FIGURE 2 is a further enlarged showing, with some parts removed and others broken away, of the device shown in FIGURE 1 and illustrating elements thereof soldered in accordance with the present invention.
FIGURE 3 is a still further enlarged sectional view of elements seen in FIGURE 2 and illustrating relative positioning of these elements just prior to the solder bonding operation.
FIGURE 4 is a view similar to FIGURE 3 and showing the relation of elements after soldering in accordance with the invention.

Now making more particular reference to the drawing, FIGURES 1 and 2 show a transistor assembly 10 comprising an eyelet type stem assembly 11 and an overlying closure member or cap 12. The stem eyelet 13 (FIGURE 2) houses a core 14 of insulating material, such as glass, through which extend a plurality of lead wires 15 having portions disposed for electrical connection to elements of the transistor 16. The transistor comprises a thin wafer 20 of semiconductive material having disposed upon opposed surface portions thereof an alloy emitter contact 21 and an alloy connector contact 22 (see also FIGURES 3 and 4). Electrical connection to emitter contact 21 and to the base portion of wafer 20 is made through respective filament or whisker wires 23 and 24 as shown, collector electrode 22 being connected for both thermal and electrical energy transfer therefrom to the housing through the agency of a cylindrically formed portion 28 of stud 25 mounted in stem sub-assembly 26. As shown, sub-assembly 26 comprises a flange 30 sandwiched between confronting respective flange portions 31 and 32 (FIGURE 1) of cap 12 and stem eyelet 13. Subassembly 26 includes a pair of apertures 33 each of which has a glass bead 34 disposed therein providing for insulative support of electrically conductive tabs 35. Wire 23 is electrically connected to one of the tabs 35, and wire 24 is similarly connected to the other of the tabs 35. A pair of additional apertures 36 in subassembly 26 have insulative sleeves 40 through which a pair of lead wires 15 extend, this pair of wires being electrically attached to tabs 35 by connectors 18 as shown. Another of the wires 15 extends through the remaining aperture 36 and is electrically connected with sub-assembly 26 by strap means 17.

During normal operation of semiconductive devices a considerable quantity of heat is generated within the rectifying barrier regions of the device and, in the case of transistors, at the collector junction. It is therefore desirable to provide a path of low thermal impedance from this heat source to an appropriate heat sink thereby effectively to decrease the temperature rise produced at the collector junction for each unit of dissipated power.

It is the achievement, by soldering, of ohmic contact of a low thermal impedance, between stud 25, preferably of nickel-plated silver, and collector contact or pellet 22, with which the present invention is concerned, as will be hereinafter more fully explained. The path of heat in the present embodiment is through collector contact 22, stud 25, stem sub-assembly 26, then to the housing comprising cap 12 and stem assembly 11. (See the inverted showings of Figures 3 and 4.) According to usual practice, cap 12 of the housing is disposed in heat exchange relation with a mass capable of absorbing the heat delivered to cap 12 in the course of operation of the transistor.

As best seen in FIGURE 4—wherein, as above stated, semiconductive body or wafer 20 with stud 25 attached has has been inverted for the sake of convenience and in order better to illustrate the invention—stud 25 is aligned substantially concentrically with collector contact 22 and frustro-conical portion 29 of the stud is disposed in close connection with the very small layer of collector contact material, for example indium, which separates this portion of the stud for the semiconductive body 20.

FIGURE 3 illustrates the relative positioning of stud 25 and electrode 22 at the instant of initiation of the soldering operation, when its stud has been centered and the solder has not yet melted. A small bead of solder 27 is shown attached to the lower, frustro-conical end 29 of the stud in contact with the electrode.

With reference being made also to FIGURES 5, 6, and 7, apparatus for achieving the solder connection illustrated in FIGURE 4 comprises base plate means 41 upon which an arm 42 is pivotally mounted. Pivotal mounting of arm 42 is provided by a pair of like bracket means 43 including a pivot pin 44 extending through an end portion of the arm. A lift pin or handle 45 is provided at the free end of arm 42 and provides means for grasping the latter for pivotally raising and lowering the same about pin 44. Stop means 46 disposed adjacent the free end of arm 42 provides for predetermined spacing of the arm from the base. A downwardly presented channel-like groove 50 extends across the lower side of arm 42 intermediate the free and pivoted ends of the latter and is lined with suitable electrically insulative means 51.

Induction heating coil means 52 is mounted in insulated groove 50 and includes a single turn coil element 53 disposed substantially to one side of arm 42, and the lead straps 54, separated one from the other by electrically insulative means 57, extending from the coil element through groove 50 to the other side of the arm. Lead elements 54 are affixed to the arm by electrically non-conductive screws 55. Spacing of elements 54 from the arm is provided by insulative sleeve elements 58 through which screws 55 pass. Spacing of the lead and coil elements in this manner advantageously minimizes the effects of inductive coupling between metal arm 42 and coil means 52, which coupling would of course introduce power losses detracting from efficient operation of the apparatus.

Flexible insulated lead means 56 are attached to elements 54 and are connected to a suitable source of energy comprising, for example a radio frequency oscillation generator 60 (FIGURE 7). A commercially available 1KW induction heater power unit has been found suitable for use as the generator.

Turning now to means for holding tthe transistor blank assembly during the soldering operation, and in accordance with usual practice, the semiconductive wafer 20 has attached thereto a base tab 61 disposed in predetermined oriented relation as respects the location of collector electrode 22 to which stud 25 is to be solder bonded. The wafer and tab assembly is supported by portable carrier means 62 (FIGURE 5) having a base portion 63 and a chuck portion 64. Base portion 63 of the carrier means is positionable, within locator means 65 upon base plate means 41. Positioning of locator means 64 is such that the carrier means 62 disposed therein positions a wafer and tab assembly so that the bead-like collector electrode or pellet 22 is disposed below, and its polar axis aligned concentric with, the curved induction coil element 53 (FIGURES 5 and 6). Portable carrier means 62 is of course positioned while lever arm 42 is raised, following which the arm is lowered into the rest position shown.

A funnel shaped, insulative member 66 is aligned coaxially with, and includes a main body portion 67 disposed above, induction coil element 53, and a tube portion 68 of member 66 extends through the core region of the coil element. Member 66 therefore effectively is a guide member adapted to receive and guide a stud 25, with solder bead 27 attached (FIGURE 3), onto collector contact 22 and in position roughly approximately in axial alignment therewith. While for the sake of convenience collector pellet 22 has been shown as having a planar top surface, it will be understood that this surface may in some instances be curved, for example convexly.

While not necessary to the present invention, but in view of the relatively small sizes of the stud and semiconductive body elements being soldered in the illustrated embodiment, a microscope (not shown) may be used to observe the relative positioning of the elements being bonded, as well as to ensure sufficient heating by observing the flow of solder.

In performance of the soldering operation, a stud is positioned as seen in FIGURES 3 and 6, in rough general alignment with coil 53 by tube portion 68 of member 66. If desired, a droplet of fluxing solution then may be applied to the juncture of the stud with electrode 22. Induction coil element 53 is then energized to induce a current in stud 25, and in the solder 27, to heat the latter and melt the same. Current induced in stud 25 also sets up a magnetic field in opposition to the field created by induction coil element 53. The field induced about stud 25 tends precisely to center the latter as respects coil element 53, which action also ensures the desired centering of stud 25 as respects collector electrode 22. As heat continues to be generated in solder 27, it melts and some local melting of electrode 22 may take place. As the solder melts, the weight of the stud combined with capillary action of the molten solder along lateral surfaces of the stud accommodates sinking of the latter into the molten solder. This latter phenomenon contributes to the achievement of structurally sound, electrically conductive mounting of the wafer to the stud, said mounting having low thermal impedance due to separation of the stud from the wafer by but the relatively thin layer of collector electrode material. After establishing, as by the aforementioned observation, that satisfactory solder attachment of the stud has been made, wafer 20 is severed from base tab 61.

From the foregoing description it is seen that the invention provides a novel method of and improved means for soldering a stud to the collector electrode of a semiconductive device, which minimizes the effects of variations in operator technique in the formation of a good collector to stud solder connection.

Advantages of the above described invention will be appreciated further in light of previous known methods of soldering studs to electrodes which permitted no freedom of movement for either of the elements while they were being solder bonded. Successful solder bonds between lead wire and electrode elements of a semiconductive device heretofore have been dependent primarily upon the ability of an operator accurately to position the lead wire element over the electrode element and to bring the two elements in contact with one another with the proper amount of force. Frequently, instances of semiconductive base "push-through" and so-called "hour-glass" shaped solder joints occurred when an operator failed to position the wire and electrode elements correctly. The invention therefore provides means for achieving more uniform and reproducible joints by allowing the lead element or stud to have freedom along its vertical axis during the soldering operation. This freedom is accomplished in the present invention by allowing the stud to rest in a generally vertical position upon the collector electrode while the induction field is set up. Due to the relatively high electrical conductivity of the stud, the induced currents advantageously produces heat primarily in the solder, not in the stud or the semiconductive material, to effect the solder bond. Also, by virtue of the induced field, the stud is more accurately aligned with the electrode. The use of a non-clamping stud positioning means therefore permits the molten solder to wet the tapered stud and pull it toward the base semiconductive material, thereby further insuring alignment and thermal coupling of the stud with the collector electrode.

While the invention has been illustrated and described in conjunction with soldering of a silver stud to an indium electrode, preferably using a cadmium-indium alloy solder, it will be understood that the invention contemplates soldering of lead wire and electrode elements of other types. In this regard it is pointed out that preferential heating of the solder alone advantageously is achieved by this invention inasmuch as heat is induced primarily in the comparatively high resistance solder, with little or no heating being induced in the lead wire element and semiconductive body.

It will be understood, however, that such modifications may be made in practicing the invention as are contemplated by the scope of the appended claims.

I claim:

1. A method for solder-bonding an electrically conductive lead element having a body of solder affixed thereto to an electrode affixed to the surface of a semiconductive body, which method comprises: effecting generally axial alignment of said lead element with said electrode while disposing the body of solder in contact with said electrode; and inducing a current in said element and said solder sufficient to heat the solder and melt the same, thereby to effect the solder bond, by conducting high frequency energy in a curved path substantially axially aligned with said electrode and utilizing the combined effect of the inducing field, and of the field induced in the lead element, to maintain axial alignment of said lead element with said electrode.

2. A method in accordance with claim 1, and wherein said maintained axial alignment is along a line substantially perpendicular to the surface of said semiconductive body.

3. In a method for induction soldering an electrically conductive lead wire element to an electrode of a semiconductive body, the steps comprising: providing a lead element having solder in contact with the same; effecting generally axial alignment of said lead element with said electrode while disposing the solder in contact with said electrode; and conducting high frequency energy in a curved path substantially axially aligned with said electrode, while the latter is contacting said solder to induce current in the lead element and the solder to heat and melt the latter, and to induce in said lead element an opposing magnetic field effecting precise alignment of said element with said electrode.

4. A method for solder bonding a lead element to an electrode of a semiconductive body, which method comprises: effecting generally axial alignment of a lead element and an electrode while disposing solder in contact with said lead element and electrode; and conducting radio frequency energy in a curved path substantially axially aligned with the polar axis of said electrode, while the latter contacts the solder, to induce current in the lead element and the solder to melt the latter and to induce in said lead element an opposing magnetic field effecting precise alignment of said lead element with said electrode, thereby to form the solder bond between said lead element and said electrode.

5. A method for induction soldering an electrically conductive cylindrical stud to an electrode disposed upon the surface of a semiconductive body, which method comprises: disposing an end of said stud in position extending generally normal to a central region of said electrode; disposing a body of solder in contact with said stud and said electrode; generating radio frequency energy; and conducting the generated radio frequency energy in a path substantially concentric with a line normal to the center of said electrode, while the electrode is contacting said stud and solder, to induce currents in the stud and solder to heat the latter and melt the same and to create in the region of said stud a magnetic field in opposition to the inducing field to effect precise alignment of said stud with said electrode, thereby to form the solder bond between said stud and said electrode.

6. Apparatus for effecting solder-bonding of a lead element to a bead-like electrode of a semiconductive body by induction heating, said apparatus comprising: fixture means for mounting said semiconductive body with the electrode presented upwardly; a source of radio frequency energy; electrically insulative guide means disposed and adapted to guide such a lead element, having solder attached thereto, into generally axial alignment and contact with said electrode; and means for effecting precise axial alignment of the lead element with the electrode, including induction coil means disposed adjacent said insulative guide means for precise vertical axial alignment with such electrode, said coil means being connected to said source of energy and disposed to encircle a lead element, and operative when energized to induce in such lead element and solder sufficient current to heat the solder to melt the same and to create a magnetic field in such lead element effective to maintain precise axial alignment of the lead element with said electrode.

7. Apparatus for induction soldering an electrically conductive stud having a body of solder affixed thereto to the electrode of a semiconductive body, said apparatus comprising: a radio frequency generator; means for effecting disposition of a stud in generally axial alignment with such electrode and with a body of solder in contact with the latter; and means for effecting precise axial alignment of the stud with the electrode, including means for conducting the output of said radio frequency generator in a curved path about such stud and in precise axial alignment with an electrode of a semiconductive body, said means for effecting alignment being operative to induce a current in such stud and solder to melt the latter and to create a magnetic field cooperative with the inducing field of the conducted radio frequency energy to effect precise axial alignment of such stud with such electrode.

8. In combination with apparatus for solder-bonding a lead element of relatively low resistivity, having a body of solder of relatively high resistivity, in contact therewith, to an electrode of a semiconductive device, means for effecting preferential heating of the solder to melt the same to form the bond and for effecting precise axial alignment of said wire element with the polar axis of said electrode comprising: means for maintaining disposition of such a lead wire element in generally axial alignment with such an electrode, and solder in contact with such element and electrode; and means for conducting high frequency energy in close coupling arrangement with such lead wire element and in a path coaxial with the polar axis of such electrode, said means for conducting energy being operative to induce current in such element and solder effective to heat and melt the latter, and to create an opposing magnetic field in such element effecting precise alignment of the latter wih such elecrode.

9. In combination with apparatus for solder bonding a lead wire element of relatively low resistivity, having a body of solder of relatively high resistivity affixed thereto, to an electrode of a semiconductive device, means for effecting preferential heating of the solder to melt the same and to form the bond for effecting precisely predetermined positioning of said lead wire element as respects said electrode, comprising: electrically non-conductive guide means disposed and adapted to maintain generally axial alignment of a lead wire element with the polar axis of an electrode; and means defining a curved path for conducting high frequency energy in close coupling arrangement with a lead wire element disposed within said electrically non-conductive guide means and operative to induce current in such wire element and solder to heat and melt the latter and to create a magnetic field cooperative with the inducing field to effect precise axial alignment of the lead wire element with the electrode.

10. Apparatus in accordance with claim 9 wherein said means defining a curved path for conducting high frequency energy comprises a single turn coil element adapted to support said electrically non-conductive guide means.

11. Apparatus for solder bonding an electrically conductive lead wire element to the electrode of a semiconductive body, comprising: means for positioning such a lead wire element in generally axial alignment with such an electrode and with a body of solder in contact with such electrode and lead wire element; and means operative both to effect precise axial alignment of such lead wire element and electrode and to melt the solder to effect the solder bond, including means for conducting high frequency energy in a curved path disposed for axial alignment with such a lead wire element to induce a magnetic field in such lead element to heat the same and melt the solder and cooperative with the inducing field to provide the aforesaid precise alignment.

References Cited in the file of this patent

UNITED STATES PATENTS

| | | |
|---|---|---|
| 2,705,768 | Kleimack et al. | Apr. 5, 1955 |
| 2,792,489 | Wohlman | May 14, 1957 |
| 2,798,927 | Lefcourt et al. | July 9, 1957 |
| 2,914,641 | Yuhasz | Nov. 24, 1959 |